(12) United States Patent
Sekiya

(10) Patent No.: US 7,994,025 B2
(45) Date of Patent: Aug. 9, 2011

(54) WAFER PROCESSING METHOD WITHOUT OCCURRENCE OF DAMAGE TO DEVICE AREA

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/902,311

(22) Filed: Oct. 12, 2010

(65) Prior Publication Data

US 2011/0097852 A1    Apr. 28, 2011

(30) Foreign Application Priority Data

Oct. 28, 2009    (JP) .................................. 2009-247530

(51) Int. Cl.
  *H01L 21/00*    (2006.01)

(52) U.S. Cl. ........ 438/460; 438/113; 438/114; 438/462; 257/E21.599; 257/E21.6

(58) Field of Classification Search ............... 257/E21.6; 438/462
See application file for complete search history.

(56) References Cited

U.S. PATENT DOCUMENTS

2007/0007247 A1 * 1/2007 Sekiya .............................. 216/88

FOREIGN PATENT DOCUMENTS

JP    2007-019461    1/2007

* cited by examiner

*Primary Examiner* — Ha Tran T Nguyen
*Assistant Examiner* — Shaka Scarlett
(74) *Attorney, Agent, or Firm* — Greer, Burns & Crain, Ltd.

(57) ABSTRACT

A wafer processing method of processing a wafer having on a front surface a device area where a plurality of devices are formed by being sectioned by predetermined dividing lines, and an outer circumferential redundant area surrounding the device area, includes the steps of: sticking a protection tape to the front surface of the wafer; holding a protection tape side of the wafer by a rotatable chuck table, positioning a cutting blade on a rear surface of the wafer, and rotating the chuck table to cut a boundary portion between the device area and the outer circumferential redundant area to form a separation groove; grinding only the rear surface of the wafer corresponding to the device area to form a circular recessed portion to leave the ring-like outer circumferential redundant area as a ring-like reinforcing portion, the wafer being such that the device area and the ring-like outer circumferential redundant area are united by the protection tape; and conveying the wafer supported by the ring-like reinforcing portion via the protection tape.

1 Claim, 6 Drawing Sheets

WAFER PROCESSING METHOD WITHOUT OCCURRENCE OF DAMAGE TO DEVICE AREA

BACKGROUND OF THE INVENTION

1. Field of the Invention

The present invention relates to a wafer processing method capable of handling a wafer without any damage such as a crack or the like to a device area whose rear surface is ground thinly.

2. Description of the Related Art

In the semiconductor device production process, a generally disk-like semiconductor wafer is sectioned into a plurality of areas along predetermined dividing lines called streets arranged in a lattice pattern on the front surface thereof. Devices such as ICs, LSIs or the like are formed on the areas thus sectioned. The semiconductor wafer is cut along the streets by a cutting device to be divided into individual semiconductor devices (chips). The wafer to be divided is formed at a predetermined thickness by grinding its rear surface before being cut along the streets. In recent years, a wafer has been required to be reduced in thickness to e.g. approximately 50 μm in order to achieve the weight saving and downsizing of electric devices.

It is difficult to handle the wafer ground thinly as described above. The wafer is likely to be broken during conveyance or the like. To eliminate such a problem, Japanese Patent Laid-Open No. 2007-19461 proposes a grinding method as below. A wafer is ground to form a circular recessed portion on its rear surface at a portion corresponding to a device area to leave a ring-like reinforcing portion on the rear surface at a portion corresponding to an outer circumferential redundant area surrounding the device area. However, when the wafer is divided into the individual devices, it is necessary to remove the ring-like reinforcing portion. In the past, a cutting blade has been positioned at a boundary portion between the ring-like reinforcing portion and the device area and the ring-like reinforcing portion has been removed by circularly cutting the boundary portion.

SUMMARY OF THE INVENTION

The cutting blade may be positioned at the boundary portion between the ring-like reinforcing portion and the device area and the boundary portion may be cut as in the traditional way. However, in such a case, there arises a problem in that the device area is cracked by the impact of the cutting blade because the rear surface of the device area is machined thinly, which degrades the quality of devices.

It is an object of the present invention to provide a wafer processing method without the occurrence of damage such as cracks or the like to a device area.

In accordance with an aspect of the present invention, there is provided a wafer processing method of processing a wafer having on a front surface a device area where a plurality of devices are formed by being sectioned by predetermined dividing lines, and an outer circumferential redundant area surrounding the device area, including: a protection tape sticking step for sticking a protection tape to the front surface of the wafer; a separation groove forming step in which a protection tape side of the wafer is held by a rotatable chuck table, a cutting blade is positioned on a rear surface of the wafer, the chuck table is rotated to cut a boundary portion between the device area and the outer circumferential redundant area to form a separation groove, and the ring-like outer circumferential redundant area is cut off from the device area; a rear surface grinding step in which only the rear surface of the wafer corresponding to the device area is ground to form a circular recessed portion to leave the ring-like outer circumferential redundant area as a ring-like reinforcing portion, the wafer being such that the device area and the ring-like outer circumferential redundant area are united by the protection tape; and a conveying step for conveying the device area of the wafer supported by the ring-like reinforcing portion via the protection tape.

According to the present invention, the boundary portion between the device area and the outer circumferential redundant area is cut by the cutting blade with the thickness of the wafer being great; therefore, no crack occurs in the device area even if the wafer rear surface corresponding to the device area is thereafter processed thinly by grinding.

After the rear surface corresponding to the device area has been ground so that the device area has been machined to have a thickness of e.g. 50 μm or less, the thinned device area is protected by the ring-like reinforcing portion stuck to the protection tape. Thus, processing such as conveyance or the like can be achieved smoothly.

Further, when the wafer is divided into the individual devices, since the ring-like reinforcing portion has already been separated from the device area, the ring-like reinforcing portion can easily be removed without the occurrence of a crack in the device area.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
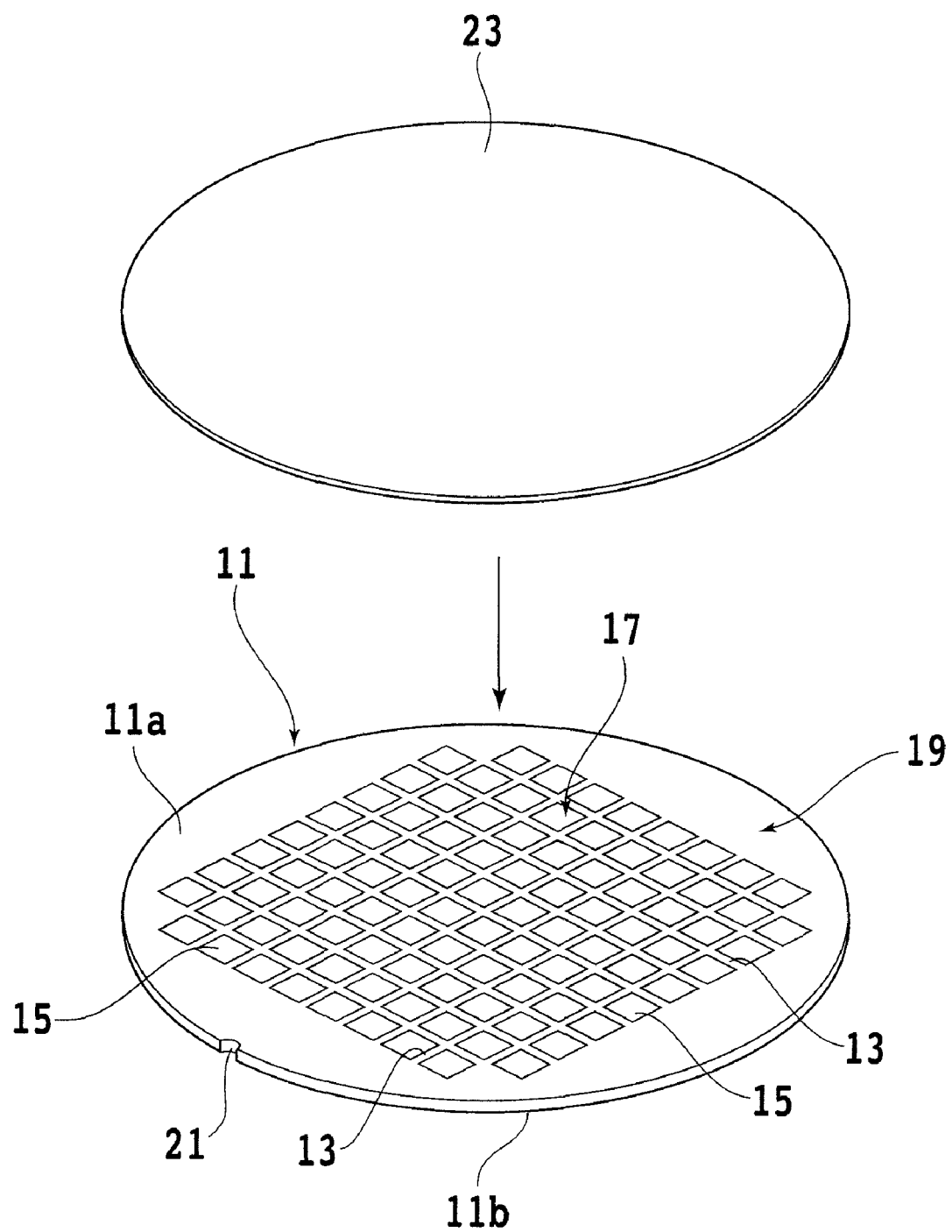
FIG. 1 is a perspective view illustrating a condition where a protection tape is stuck to the front surface of a wafer.

Preferred embodiments of the present invention will hereinafter be described in detail with reference to the drawings. A semiconductor wafer 11 illustrated in FIG. 1 is composed of a silicon wafer having a thickness of e.g. 700 μm. A plurality of predetermined dividing lines (streets) 13 are formed in a lattice pattern on a front surface 11a. In addition, devices such as ICs, LSIs or the like are formed in a plurality of respective areas sectioned by the predetermined dividing lines 13. The wafer 11 configured as above includes a device area 17 formed with the devices 15 and an outer circumferential redundant area 19 surrounding the device area 17. The wafer 11 is formed on an outer circumference with a notch 21 as a mark indicating a crystal orientation of the silicon wafer.

Figure 2:
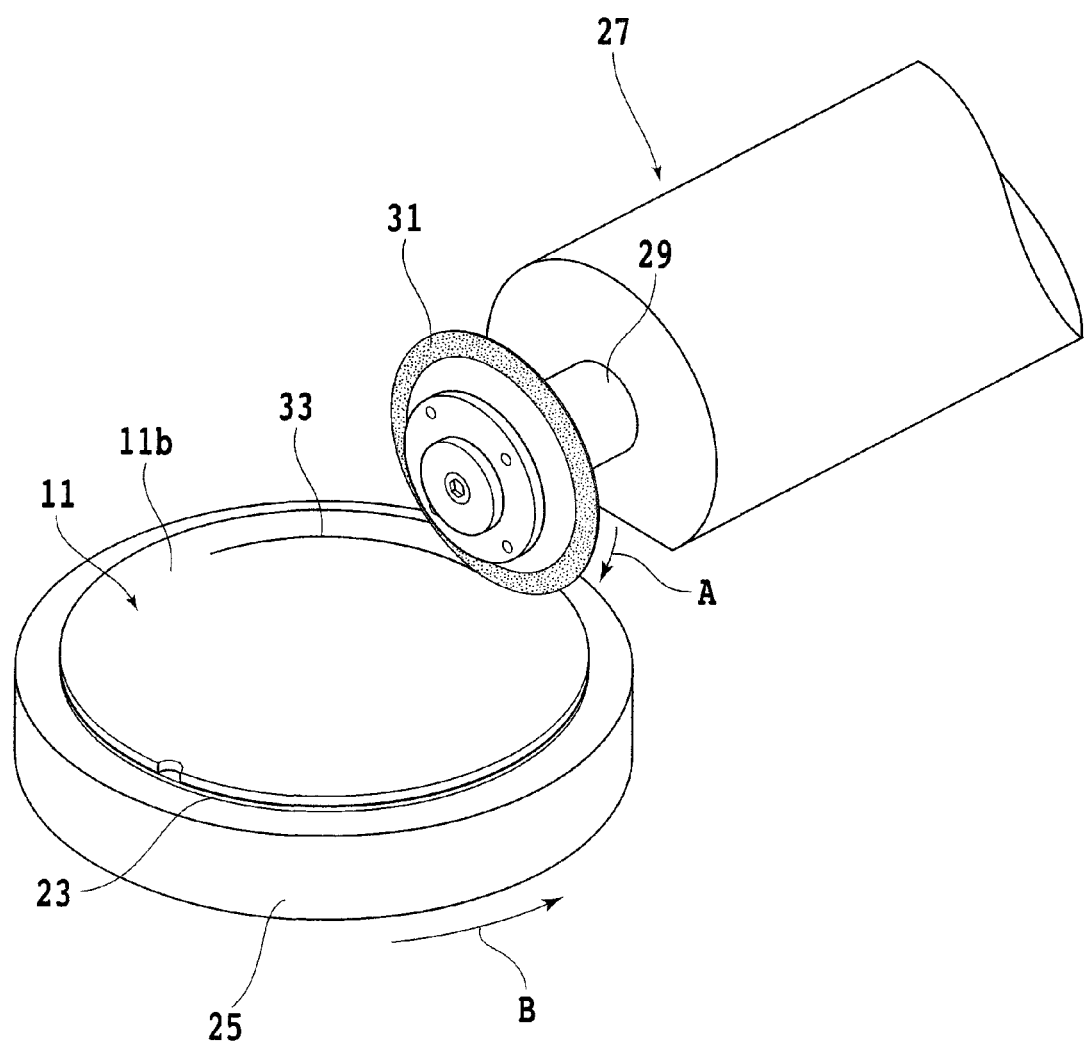
FIG. 2 is a perspective view illustrating a separation groove forming step.

In the processing method of the present invention, a protection tape 23 is stuck to the front surface 11a of the wafer 11 as illustrated in FIG. 1 in order to protect the devices 15 formed on the front surface 11a of the wafer 11. Next, a separation groove forming step in which a boundary portion between the device area 17 and the outer circumferential redundant area 19 is cut to form a circular separation groove is performed. In this separation groove forming step, the protection tape 23 side of the wafer 11 where the protection tape 23 is stuck to the front surface thereof is sucked and held by a chuck table 25 of a cutting device as illustrated in FIG. 2 so as to expose a rear surface 11b of the wafer 11. A cutting blade 31 is attached to the end of the spindle 29 of the cutting unit 27 and rotated at high speed in an arrow-A direction by a motor not illustrated.

Figure 3:
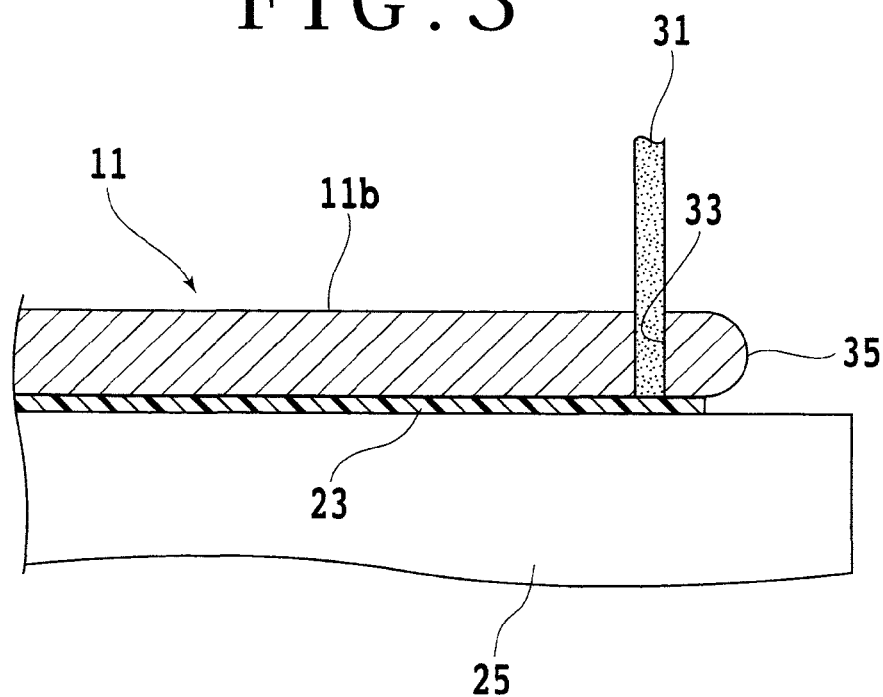
FIG. 3 is a cross-sectional view illustrating the separation groove forming step.
Figure 4:
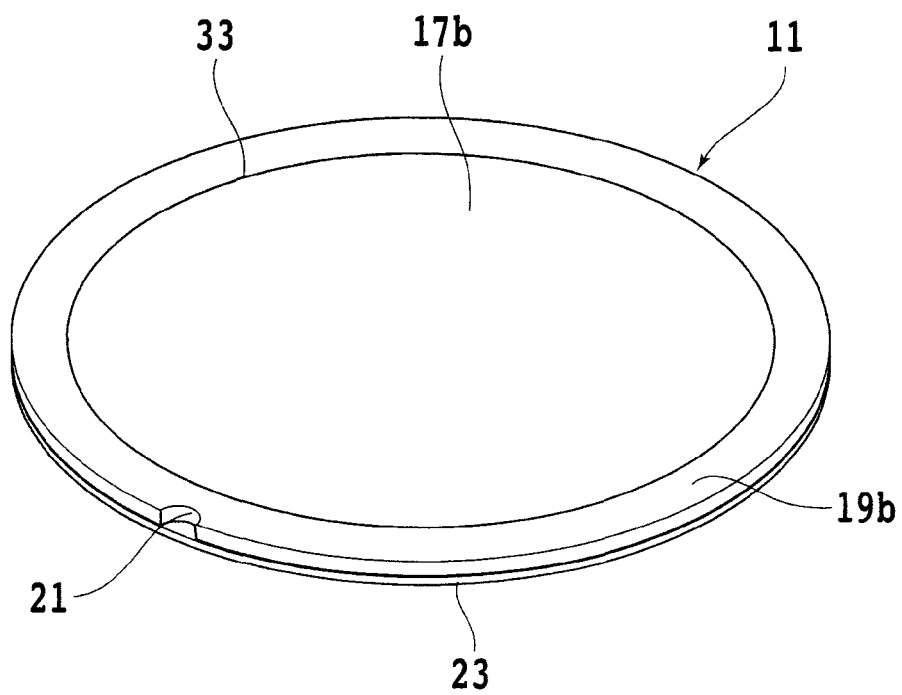
FIG. 4 is a rear view of the wafer formed with a circular separation groove.

The cutting blade 31 rotated at high speed is positioned at a portion of the rear surface 11b of the wafer 11 corresponding to the boundary portion between the device area 17 and outer circumferential redundant area 19 of the wafer 11. While the chuck table 25 is rotated at low speed in an arrow-B direction, the boundary portion between the device area 17 and the outer circumferential redundant area 19 is cut to a depth reaching the protection tape 23 as illustrated in FIG. 3 to form a circular separation groove 33. In this way, the ring-like outer circumferential redundant area 19 is cut off from the device area 17. In FIG. 3, reference numeral 35 denotes a chamfer portion. FIG. 4 illustrates a perspective view of the rear side of the wafer 11 having been subjected to the separation groove forming step. The rear surface 17b of the wafer 11 corresponding to the device area 17 and the rear surface 19b of the wafer 11 corresponding to the outer circumferential redundant area 19 are separated from each other with respect to the circular separation groove 33.

Figure 5:
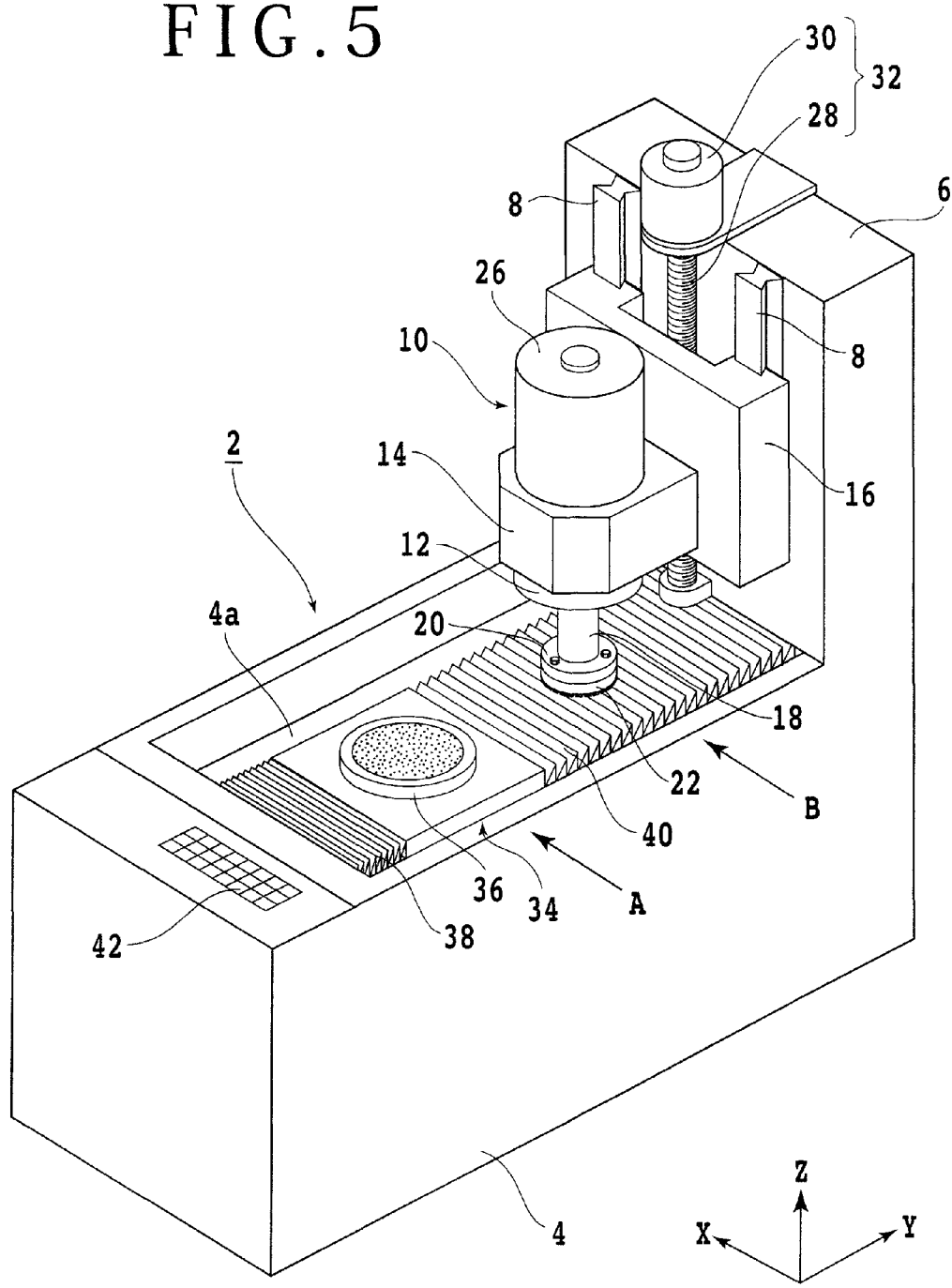
FIG. 5 is a perspective view of a grinding device.

After the separation groove forming step has been performed, a rear surface grinding step where only the rear surface corresponding to the device area 17 is ground to form a circular recessed portion is performed. The rear surface grinding step uses e.g. a grinding device 2 illustrated in FIG. 5 for grinding. Reference numeral 4 denotes a housing of the grinding device 2. A column 6 is provided rearward of the housing 4 so as to extend upright. A pair of guide rails 8 extending vertically is secured to the column 6. A grinding unit (grinding means) 10 is mounted so as to be vertically shiftable along the pair of guide rails 8. The grinding unit 10 includes a housing 12 and a support portion 14 holding the housing 12. The support portion 14 is mounted to a shift base 16 shifted vertically along the pair of guide rails 8.

The grinding unit 10 includes a spindle 18 which is rotatably housed in the housing 12; a mounter 20 secured to the end of the spindle 18; a grinding wheel 22 screw-fastened to the mounter 20 and having a plurality of annularly arranged grinding stones; and a servo motor 26 rotatably driving the spindle 18. The grinding device 2 is provided with a grinding unit shifting mechanism 32, which is composed of a ball screw 28 vertically shifting the grinding unit 10 along the pair of guide rails 8 and a pulse motor 30. Driving the pulse motor 30 turns the ball screw 28 to vertically shift the shift base 16.

The housing 4 is formed on an upper surface with a recessed portion 4a, in which a chuck table mechanism 34 is disposed. The chuck table mechanism 34 has a chuck table 36, which is shifted by a shifting mechanism not illustrated in a Y-axial direction between a wafer removable position A illustrated in FIG. 5 and a grinding position B opposed to the grinding unit 10. Reference numerals 38 and 40 denote bellows. A control panel 42 used by an operator of the grinding device 2 to input grinding conditions, etc. is disposed on the front side of the housing 4.

A brief description is hereinafter given of the wafer processing method. In this method, by the grinding device 2 configured as above the circular recessed portion is formed on the rear surface of the semiconductor wafer 11 at a portion corresponding to the device area 17 to leave a ring-like reinforcing portion at the outer circumferential redundant area 19. The wafer 11 to which the protection tape 23 is stuck as illustrated in FIG. 1 is sucked onto and held by the chuck table 36 positioned at the wafer removable position A illustrated in FIG. 5 with the protecting tape 23 facing downward. Next, the chuck table 36 is shifted in the Y-axial direction and positioned at the grinding position B.

Figure 6:
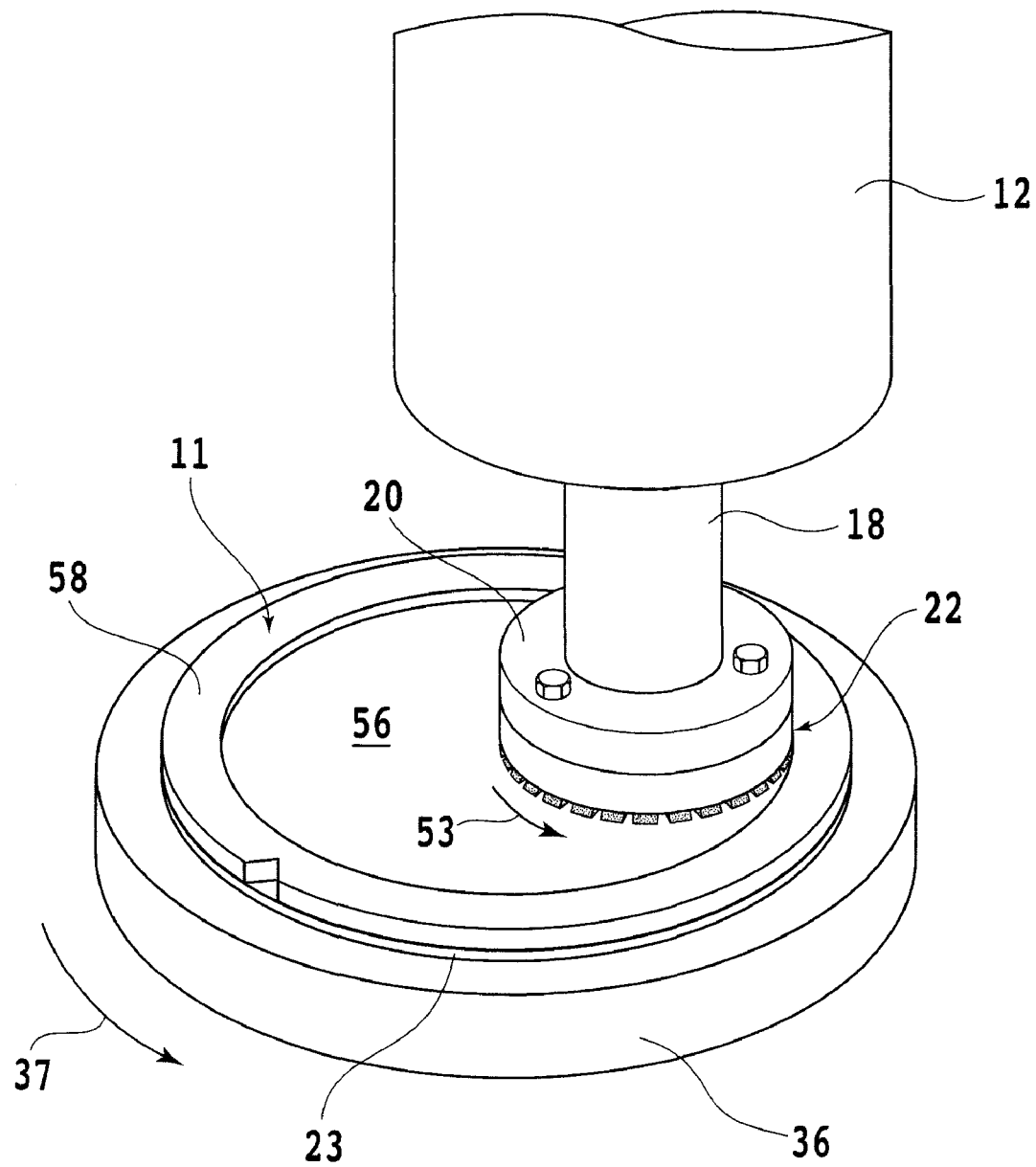
FIG. 6 is a perspective view illustrating a rear surface grinding step performed by a grinding wheel.
Figure 7:
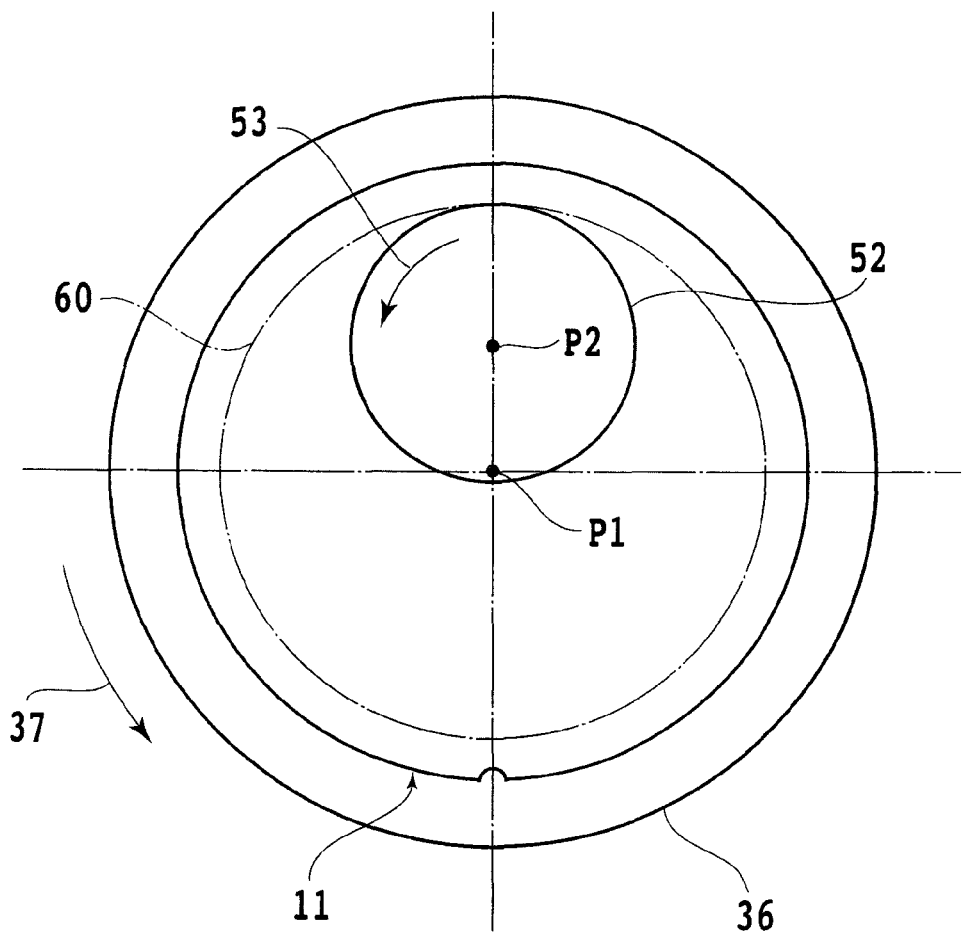
FIG. 7 is an explanatory view of the rear surface grinding step.
Figure 8:
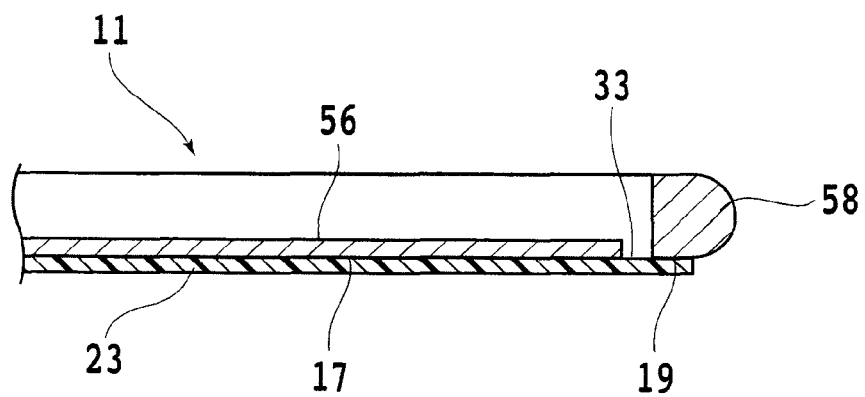
FIG. 8 is a cross-sectional view of the wafer having been subjected to the rear surface grinding step.

As illustrated in FIGS. 6 and 7, while the chuck table 36 is rotated at e.g. 300 rpm in a direction indicated with arrow 37, grinding stones 52 are rotated at e.g. 6000 rpm in a direction indicated with arrow 53. In addition, the grinding unit shifting mechanism 32 is driven to bring the grinding stones 52 of the grinding wheel 22 into contact with the rear surface of the wafer 11. Then, the grinding wheel 22 is grinding-transferred downward by a given amount at a given grinding-transfer rate. In this way, as illustrated in FIGS. 6 and 8 the rear surface of the semiconductor wafer 11 is ground and removed at an area corresponding to the device area 17 to form a circular recessed portion 56 with a given thickness (e.g. 30 μm). In addition, an area corresponding to the outer circumferential redundant area 19 is left to form a ring-like reinforcing portion (ring-like protruding portion) 58.

A description is here given of the relationship between the wafer 11 held by the chuck table 36 and the grinding stones 52 constituting the grinding wheel 22 with reference to FIG. 7. The rotational center P1 of the chuck table 36 and the rotational center P2 of the grinding stones 52 are eccentric to each other. The outer diameter of the grinding stones 52 is set at such a size as to be smaller than the diameter of the boundary line 60 between the device area 17 and outer diameter circumferential redundant area 19 of the wafer 11 and greater than the radius of the boundary line 60. The annularly arranged grinding stones 52 pass through the rotational center P1 of the chuck table 36.

FIG. 8 illustrates a cross-sectional view of the wafer 11 having been subjected to a rear surface grinding step. The circular separation groove 33 formed in the separation groove forming step is formed between the circular recessed portion 56 and the ring-like reinforcing portion 58. The device area 17 machined thinly is supported by the ring-like reinforcing portion 58 via the protection tape 23. Therefore, when the wafer 11 is conveyed for the processing of a subsequent step, the conveyance can be performed smoothly because the device area 17 machined thinly is protected by the rink-like reinforcing portion 58.

When the wafer 11 is divided into individual devices 15, since the ring-like reinforcing portion 58 has already been separated from the device area 17, it can easily be removed without the occurrence of a crack in the device area 17. The device area 17 of the wafer 2 machined thinly is supported by the annular frame via a dicing tape. The device area 17 is sucked and held by the chuck table of the cutting device via the dicing tape. The device area 17 is diced by the cutting blade so that the wafer 2 can be divided into the individual devices 15.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of processing a wafer having on a front surface, a device area where a plurality of devices are formed by being sectioned by predetermined dividing lines, and an outer circumferential redundant area surrounding the device area, comprising:

a protection tape sticking step for sticking a protection tape to the front surface of the wafer;

a separation groove forming step in which a protection tape side of the wafer is held by a rotatable chuck table, a cutting blade is positioned on a rear surface of the wafer, the chuck table is rotated to cut a separation groove between the device area and the outer circumferential redundant area to form a ring-like outer circumferential redundant area cut off from the device area;

a rear surface grinding step, following the separation groove forming step, in which only the rear surface of the wafer corresponding to the device area is ground to form a circular recessed portion to leave the ring-like outer circumferential redundant area as a ring-like reinforcing portion, the wafer being such that the device area and the ring-like outer circumferential redundant area are united by the protection tape; and a conveying step for conveying the device area of the wafer supported by the ring-like reinforcing portion via the protection tape.

\* \* \* \* \*